(12) United States Patent
Kuhara

(10) Patent No.: US 6,611,143 B2
(45) Date of Patent: Aug. 26, 2003

(54) MRI APPARATUS GENERATING ODD AND/OR EVEN ECHO IMAGES WITH SENSITIVITY DISTRIBUTION OF COILS

(75) Inventor: Shigehide Kuhara, Otawara (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/803,023

(22) Filed: Mar. 12, 2001

(65) Prior Publication Data

US 2002/0000805 A1 Jan. 3, 2002

(30) Foreign Application Priority Data

Mar. 14, 2000 (JP) ........................................ 2000-070944

(51) Int. Cl.[7] ................................................ G01V 3/00
(52) U.S. Cl. ........................................................ 324/307
(58) Field of Search ................................. 324/306, 307, 324/309

(56) References Cited

U.S. PATENT DOCUMENTS

| 4,857,846 | A | | 8/1989 | Carlson |
|---|---|---|---|---|
| 5,422,576 | A | * | 6/1995 | Kao et al. .................... 324/309 |
| 5,830,142 | A | | 11/1998 | Kuhara |
| 5,910,728 | A | | 6/1999 | Sodickson |
| 6,043,659 | A | * | 3/2000 | McKinnon ................... 324/322 |
| 6,144,873 | A | * | 11/2000 | Madore et al. ............. 600/410 |
| 6,150,973 | A | * | 11/2000 | Pritt ............................ 342/25 |
| 6,265,873 | B1 | * | 7/2001 | Le Roux .................... 324/309 |
| 6,341,179 | B1 | * | 1/2002 | Stoyle et al. ............... 382/254 |
| 6,380,741 | B1 | * | 4/2002 | Hajnal et al. ............... 324/318 |
| 6,396,269 | B1 | * | 5/2002 | Hajnal et al. ............... 324/307 |
| 6,448,771 | B1 | * | 9/2002 | Harvey et al. .............. 324/307 |

FOREIGN PATENT DOCUMENTS

| JP | 4-200531 | 7/1992 |
|---|---|---|
| WO | WO99/54746 | 10/1999 |

OTHER PUBLICATIONS

Slavin, G. S. et al.: "Gradient Moment Smoothing: A New Flow Compensation Technique for Multi–Shot Echo–Planar Imaging" MRM 38:pp. 368–377 (1997).

Ra, J. B. et al.: "Fast Imaging Using Subencoding Data Sets from Multiple Detectors" MRM 30:142–145 (1993).

Carlson, J. W. et al.: "Imaging Time Reduction through Multiple Receiver Coil Data Acquisition and Image Reconstruction" MRM 29/681–688 (1993).

Sodickson, D. K. et al.: "Simultaneous Acquisition of Spatial Harmonics (SMASH): Fast Imaging with Radiofrequency Coil Arrays" MRM 38:591–603 (1997).

Pruessmann, K. P. et al.: "SENSE: Sensitivity Encoding for Fast MRI" MRM42:952–962 (1999).

Kuhara, S. et al.: "A Novel EPI Reconstruction Technique using Multiple RF Coil Sensitivity Maps" ISMRM 154 (2000).

Feinberg, D. A. et al.: "Echo–Planar Imaging with Asymmetric Gradient Modulation and Inner–Volume Excitation" MRM 13:162–169 (1990).

* cited by examiner

Primary Examiner—Diego Gutierrez
Assistant Examiner—Dixomara Vargas
(74) Attorney, Agent, or Firm—Nixon & Vanderhye, PC

(57) ABSTRACT

A magnetic resonance imaging apparatus includes a transmitting coil configured to generate RF pulses to a subject to be examined which is placed in a static field, a gradient coil configured to generate gradient magnetic field pulses to the subject, and a sequencer configured to control the transmitting coil and the gradient coil to continuously generate a plurality of echoes. Echoes are received by independent receiving coils. A computer generates a plurality of odd-numbered-echo-images respectively corresponding to the receiving coils on the basis of odd-numbered-echoes in the echos, generates even-numbered-echo images respectively corresponding to the receiving coils on the basis of even-numbered-echoes in the echos. The computer generates a first image by unfolding the odd-numbered-echo-images on the basis of sensitivity distributions of the receiving coils. The computer generates a second image by unfolding the even-numbered-echo-images on the basis of sensitivity distributions of the receiving coils.

15 Claims, 8 Drawing Sheets

MRI APPARATUS GENERATING ODD AND/ OR EVEN ECHO IMAGES WITH SENSITIVITY DISTRIBUTION OF COILS

CROSS-REFERENCE TO RELATED APPLICATIONS

This application is based upon and claims the benefit of priority from the prior Japanese Patent Application No. 2000-070944, filed Mar. 14, 2000, the entire contents of which are incorporated herein by reference.

BACKGROUND OF THE INVENTION

The present invention relates to a magnetic resonance imaging apparatus using a multi-echo fast imaging method represented by FSE (Fast Spin Echo) or EPI (Echo Planar Imaging).

EPI is an imaging method of continuously generating echoes by alternating the polarities of gradient fields and acquiring all data required to reconstruct one image by one excitation. This method completes imaging of one image in 50 ms, and hence can instantaneously image a moving organ such as the heart. In general, a series of echoes continuously generated after one excitation are called multiple echoes or an echo train.

As is known, the Larmor frequency of a specific proton of a region of interest is proportional to the magnetic field strength at the position of the proton. As described above, in EPI, gradient fields whose polarities alternate are used to generate multiple echoes. The direction of the positional shift of odd-numbered-echoes due to static field inhomogeneity becomes opposite to that of even-numbered-echoes. This tends to produce N/2 artifacts. Note that N is the number of encoding steps.

FIGS. 1, 2, and 3 are views for explaining N/2 artifacts. First of all, as shown in FIG. 1, odd-numbered-echoes and even-numbered-echoes are separately subjected to Fourier transform. Since the number of encoding steps is reduced to ½, aliasing occurs. As a result, aliasing images (false images) are produced at a distance corresponding to ½ the number N of data. This false image is theoretically eliminated by adding an image generated from the odd-numbered-echo and an image generated from the even-numbered-echo, as shown in FIG. 2.

In practice, however, the inhomogeneity of static fields influences odd-numbered-echoes in the opposite direction to even-numbered-echoes with respect to the frequency axis, and hence opposite positional shifts occur along the frequency axis. As a consequence, the false image is partly left in the image obtained by the above addition, as shown in FIG. 3. This is so-called N/2 artifacts.

Such N/2 artifacts are caused by various uncertain factors such as the instability of the apparatus and the like as well as the above magnetic field inhomogeneity, it is practically impossible to completely eliminate them. Various methods of eliminating N/2 artifacts by software processing have also been proposed. However, these methods require repetitive processing and take much processing time, and a portion having no aliasing is required on an image, thus imposing limitations on practical use. Furthermore, they have not been proposed as methods that can also reduce blood flow artifacts.

The relationship between a fast imaging method using multiple echoes and blood flow artifacts will be described next. Blood flow imaging is a kind of MR image forming method of forming an image with sensitivity controlled with respect to a flow by using a phenomenon in which a spin that moves in a gradient field has a phase difference with respect to a stationary spin.

In a multi-echo fast imaging method such as EPI or FSE, blood flow artifacts tend to occur. In the multi-echo imaging method, a phenomenon called even-echo rephasing (to be referred to as EER hereinafter) occurs. As is known, this is a phenomenon in which the phases of even-numbered-echoes are refocused whereas the phases of odd-numbered-echoes are shifted and dephased. If, therefore, an image is reconstructed by using both even-numbered-echoes and odd-numbered-echoes, since a change in phase occurs every other echo resulting in blood flow artifacts.

As a method of solving both this problem of blood flow artifacts and the problem of the above N/2 artifacts, a flyback method using only odd-numbered-echoes or even-numbered-echoes has been proposed. In this method, however, since only about half of the echoes are used, the data acquisition efficiency deteriorates, and the imaging time (data acquisition time) is prolonged. In addition, the spatial resolution decreases as the imaging time remains unchanged.

As a method of speeding up almost all magnetic resonance imaging methods, a reconstructing method using the sensitivity distributions of multiple RF coils has recently received a great deal of attention (see 10th Ann. Scientific Meeting SMRM, 1240, 1991). According to this method, imaging is performed upon reduction of the number of encoding steps required to reconstruct one image, and the resultant aliasing is decomposed by using the difference in sensitivity distribution among the multiple RF coils, thereby obtaining an image without aliasing. As compared with general imaging methods, in this method, since the number of encoding steps can be basically decreased in inverse proportion to the number of coils, the imaging time can be shortened. This method will be briefly described below.

Assume that the number of multiple coils is two, a desired image is represented by $I0(x,y)$, images originating from the respective coils are represented by $I1(x,y)$ and $I2(x,y)$, and the sensitivity distributions of the respective RF coils are represented by $S1(x,y)$ and $S2(x,y)$. Assume also that the length of an imaging area in the encoding direction is represented by D, and imaging is performed upon reduction of the number of encoding steps to ½ so as to thin out every other line on the K-space. In this case, D/2 aliasing occurs, and the images $I1(x,y)$ and $I2(x,y)$ in which aliasing has occurred are written as follows:

$$\begin{pmatrix} I1(x,y) \\ I2(x,y) \end{pmatrix} = \begin{pmatrix} S1(x,Y) & S1(x+D,y) \\ S2(x,Y) & S2(x+D,y) \end{pmatrix} \times \begin{pmatrix} I0(x,y) \\ I0(x+D,y) \end{pmatrix}$$

Therefore, the image $I0(x,y)$ can be obtained by multiplying an inverse matrix of S as follows:

$$\begin{pmatrix} I0(x,y) \\ I0(x+D,y) \end{pmatrix} = \begin{pmatrix} S1(x,y) & S1(x+D,y) \\ S2(x,y) & S2(x+D,y) \end{pmatrix}^{-1} \times \begin{pmatrix} I1(x,y) \\ I2(x,y) \end{pmatrix}$$

In general, when N coils are used, an image is expressed by a matrix of N×N. In the multiple echo imaging, even with the use of this reconstructing method using the sensitivity distributions of multiple RF coils, odd-numbered-echoes are used with even-numbered-echoes. Therefore the phase difference between odd-numbered-echoes and even-numbered-echoes is maintained, the blood flow artifacts in multiple echoes cannot be reduced.

As described above, in the EPI method, since data acquisition and reconstruction are performed by causing multiple echoes by using gradient fields having alternating polarities, N/2 artifacts tend to remain. In a fast imaging method using multiple echoes, e.g., EPI or FSE, since even-numberedechoes differ in phase from odd-numbered-echoes, blood flow artifacts tend to occur.

BRIEF SUMMARY OF THE INVENTION

It is an object of the present invention to remove N/2 artifacts, reduce blood flow artifacts, and improve blood flow extraction performance without sacrificing imaging time and S/N ratio in an imaging method using multiple echoes.

A magnetic resonance imaging apparatus includes a transmitting coil configured to generate RF pulses to a subject to be examined which is placed in a static field, a gradient coil configured to generate gradient magnetic field pulses, and a sequencer configured to control the transmitting coil and the gradient coil to continuously generate a plurality of echoes in accordance with a predetermined pulse sequence. The echoes are received by independent receiving coils. A computer generates a plurality of odd-numbered-echo-images respectively corresponding to the receiving coils on the basis of odd-numbered-echoes in the echoes, generates even-numbed-echo images respectively corresponding to the receiving coils on the basis of even-numbered-echoes in the echoes. The computer generates a first image without aliasing by unfolding the odd-numbered-echo-images on the basis of sensitivity distributions of the receiving coils. The computer generates a second image without aliasing by unfolding the even-numbered-echo-images on the basis of sensitivity distributions of the receiving coils. The computer generates a second image without aliasing by unfolding the even-numbered-echo-images on the basis of sensitivity distributions of the receiving coils.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a view for explaining a partial false image that is left after the addition process in FIG. 2 owing to the inhomogeneity of a static field and the like;

DETAILED DESCRIPTION OF THE INVENTION

An embodiment of the present invention will be described in detail below with reference to the views of the accompanying drawing.

(Arrangement)

Figure 1:
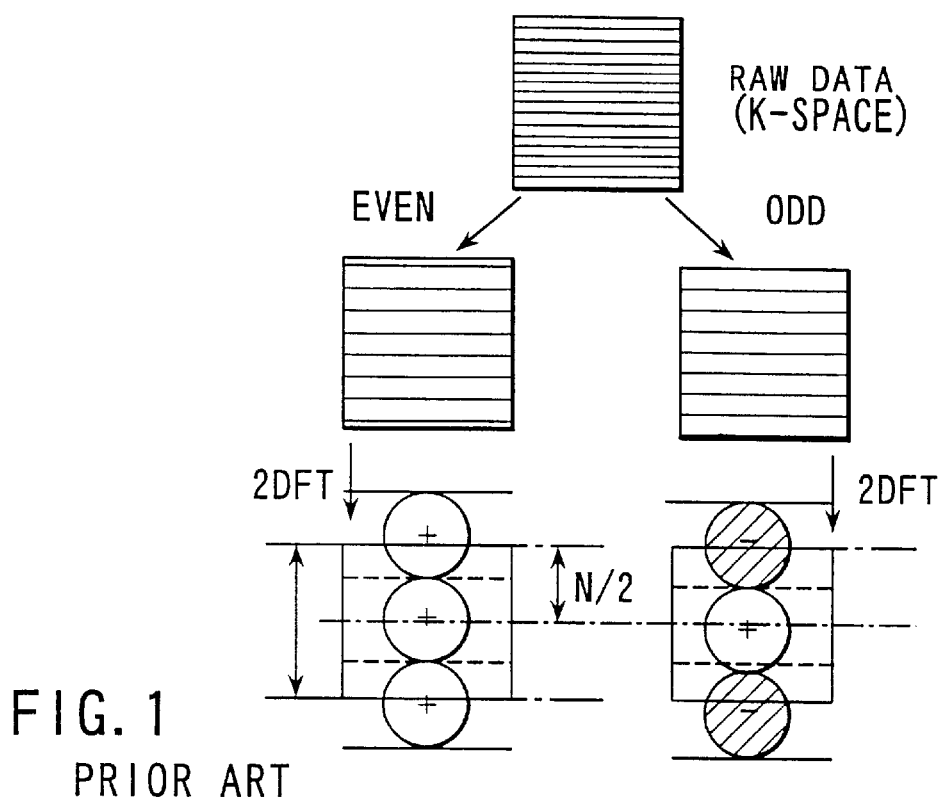
FIG. 1 is a view for explaining the process of separately performing Fourier transform for odd-numbered-echoes and even-numbered-echoes in the prior art.
Figure 2:
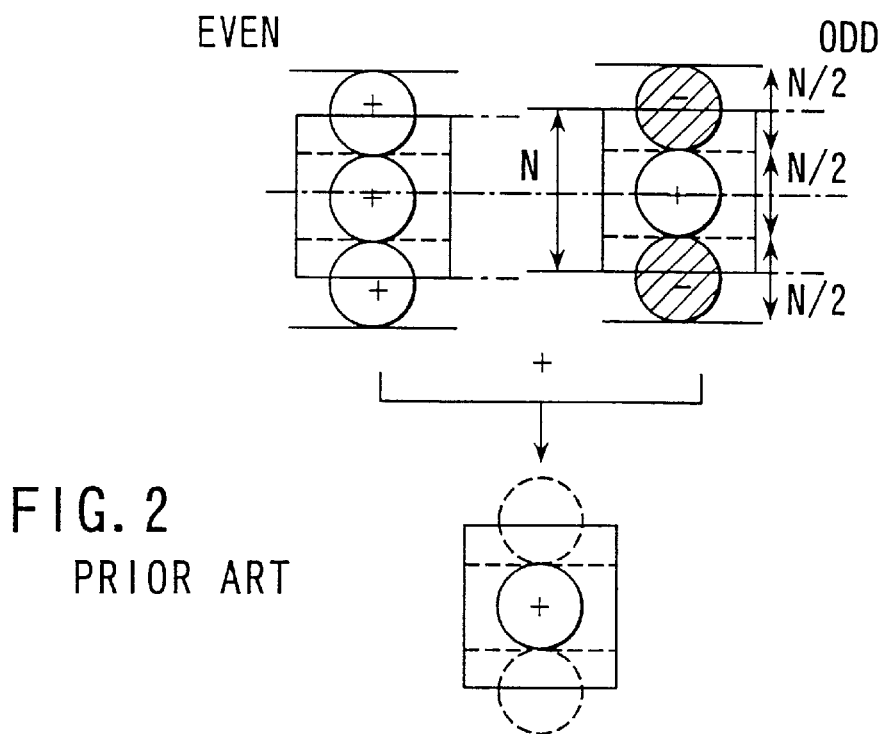
FIG. 2 is a view for explaining the processing of adding an odd-numbered-echo-image and even-numbered-echo image in the prior art.
Figure 3:
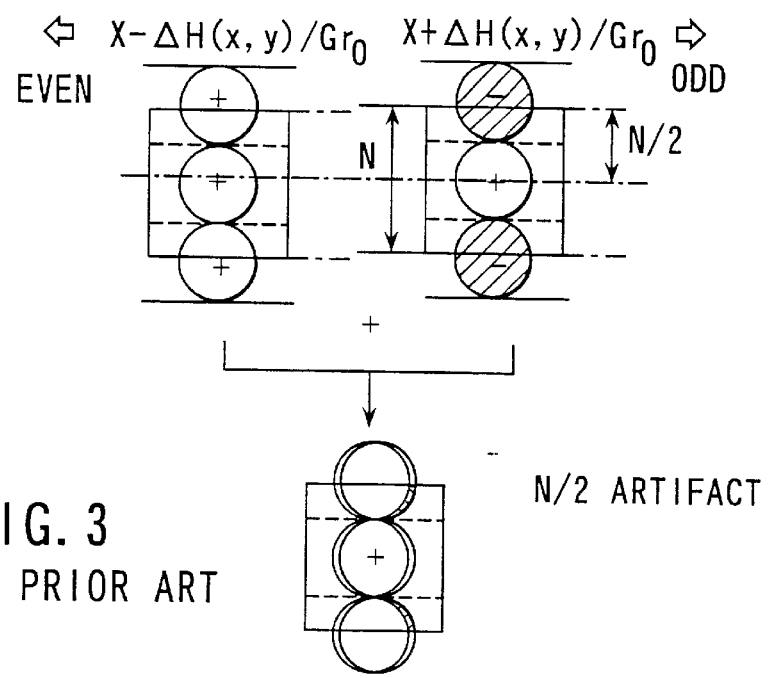
Figure 4:
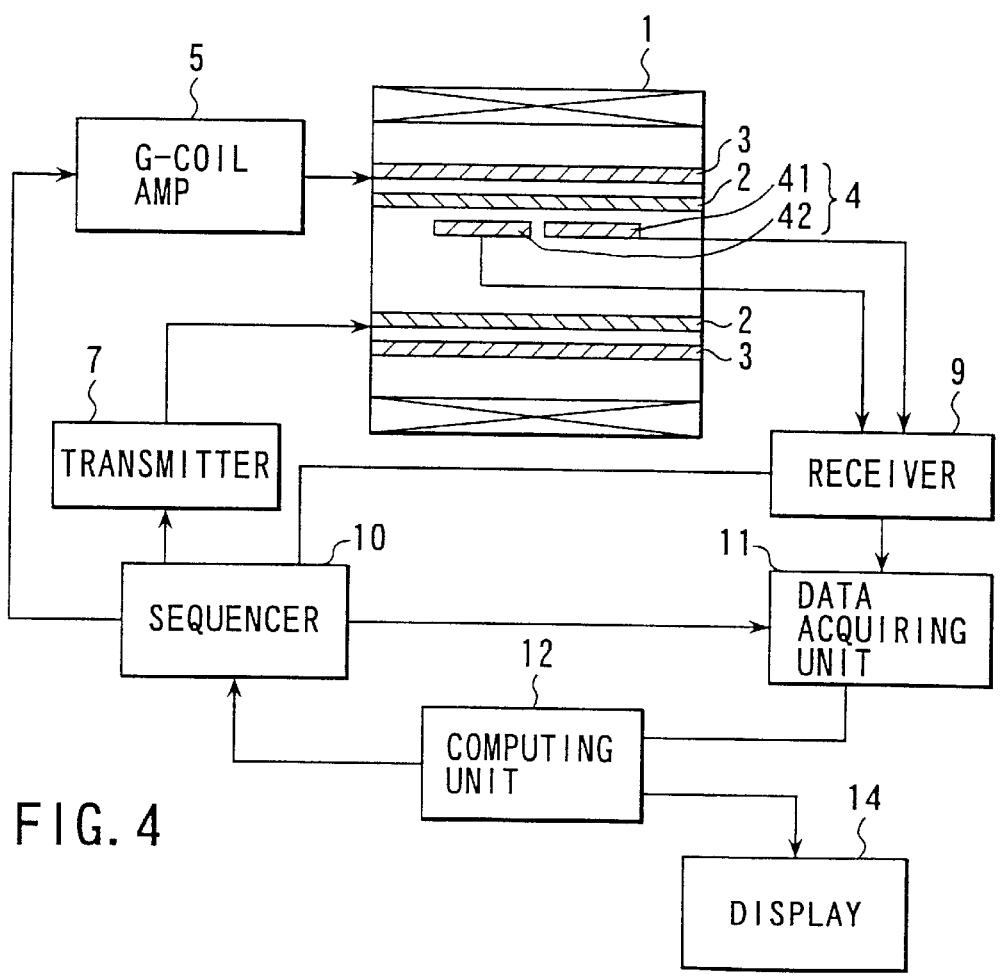
FIG. 4 is a block diagram showing the arrangement of a magnetic resonance imaging apparatus according to an embodiment of the present invention.

FIG. 4 shows the arrangement of a magnetic resonance imaging apparatus according to this embodiment. A static field magnet 1 has, for example, a cylindrical shape and generates a static field in its internal area (imaging area). Three types of gradient fields generated by a gradient field coil 3 upon reception of power from a gradient field coil power supply 5 are superimposed on this static field. A whole body type RF transmission coil 2 having a long sensitivity distribution in the body axis direction generates a high-frequency magnetic field in the above imaging upon reception of a high-frequency current from a transmitter 7. A sequencer 10 controls the RF transmission coil 2 and gradient field coil power supply 5 in accordance with a predetermined pulse sequence to sequentially generate a high-frequency pulse and gradient field pulse according to a pulse sequence. With this operation, a magnetic resonance signal (echoes in this case) is generated from an object to be examined. In this case, as the pulse sequence, a so-called multi-echo pulse sequence is used, in which a plurality of echoes are continuously generated after a nuclear spin is excited once by a high-frequency magnetic field pulse having a flip angle of, e.g., 90°. The multi-echo pulse sequence is typically based on EPI (Echo Planar Imaging) or FSE (Fast Spin Echo). Assume that in this case, the multi-echo pulse sequence is based on EPI.

An RF receiving coil array 4 is placed in the RF transmission coil 2. The RF receiving coil array 4 has a plurality of RF receiving coils 41 and 42, each of which exhibits a sensitivity distribution spatially narrower than that of the RF transmission coil 2. The plurality of RF receiving coils 41 and 42 are aligned along, for example, the body axis direction. The body axis direction corresponds to a slice axis. For the sake of descriptive convenience, it is assumed that the RF receiving coil array 4 is constituted by the first and second RF receiving coils 41 and 42. However, the number of RF receiving coils may be larger than two.

A receiver 9 receives a plurality of echoes through the first and second RF receiving coils 41 and 42, performs pre-processes such as amplification, detection, and A/D conversion for the echoes, and outputs the resultant data to a data acquiring unit 11. The data acquiring unit 11 acquires echo data in association with discrimination between the first and second RF receiving coils 41 and 42 and the sequence of occurrence of the respective echoes.

A computing unit 12 generates MR image data according to a procedure to be described later on the basis of the echo data acquired by the data acquiring unit 11.

The echoes received through the first and second RF receiving coils are subjected to a reconstructing process to acquire three types of images, i.e., (1) an image with no N/2 artifact and emphasized blood flow signals, (2) an image with no N/2 artifact, suppressed blood flow signals, and (3) an image with reduced N/2 artifacts, reduced blood flow artifacts and a maintained original S/N. A display 14 is used to display these images.

(Image Generating Process)

Figure 5:
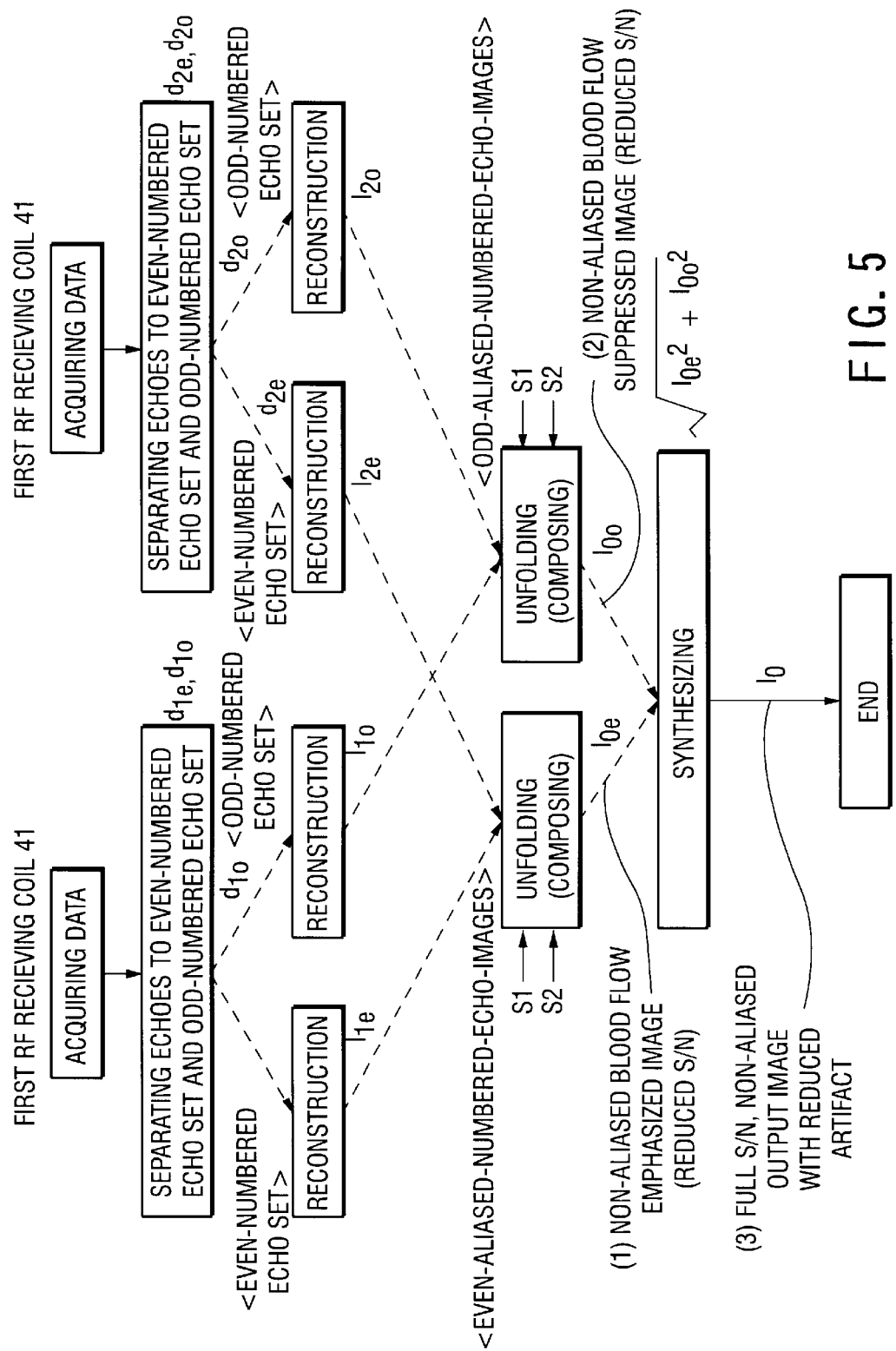
FIG. 5 is a flow chart showing a procedure for generating an image by using a computer in FIG. 4.
Figure 6:
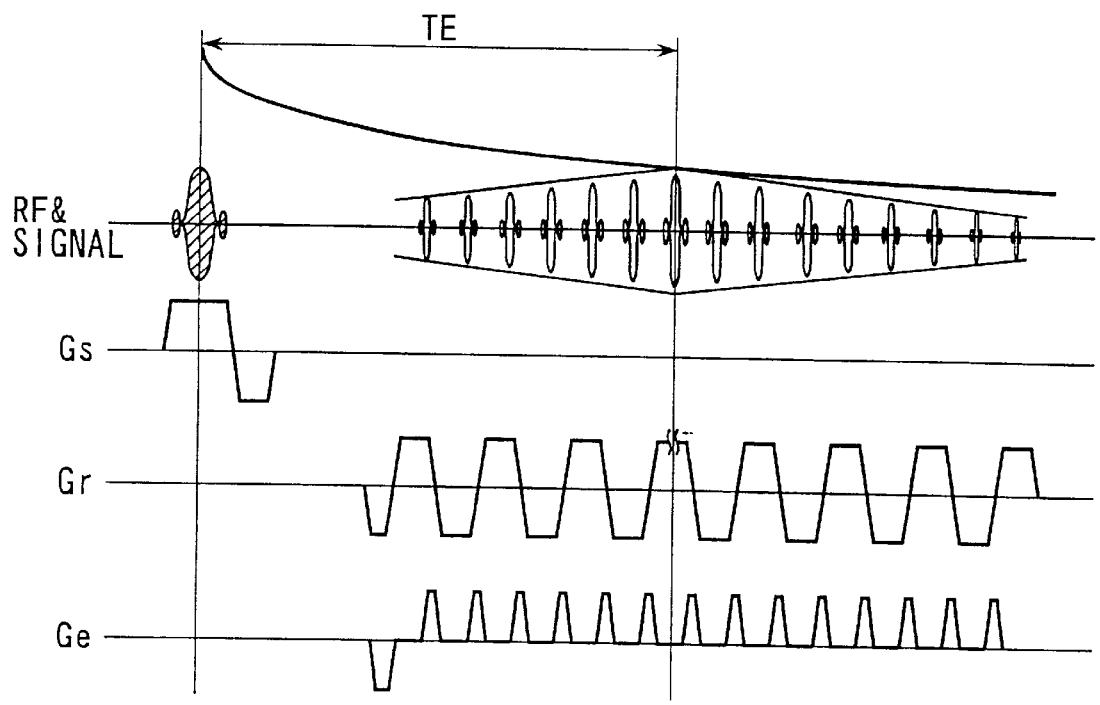
FIG. 6 is a chart showing an EPI pulse sequence as an example of a pulse sequence executed by a sequencer in FIG. 4.
Figure 7:
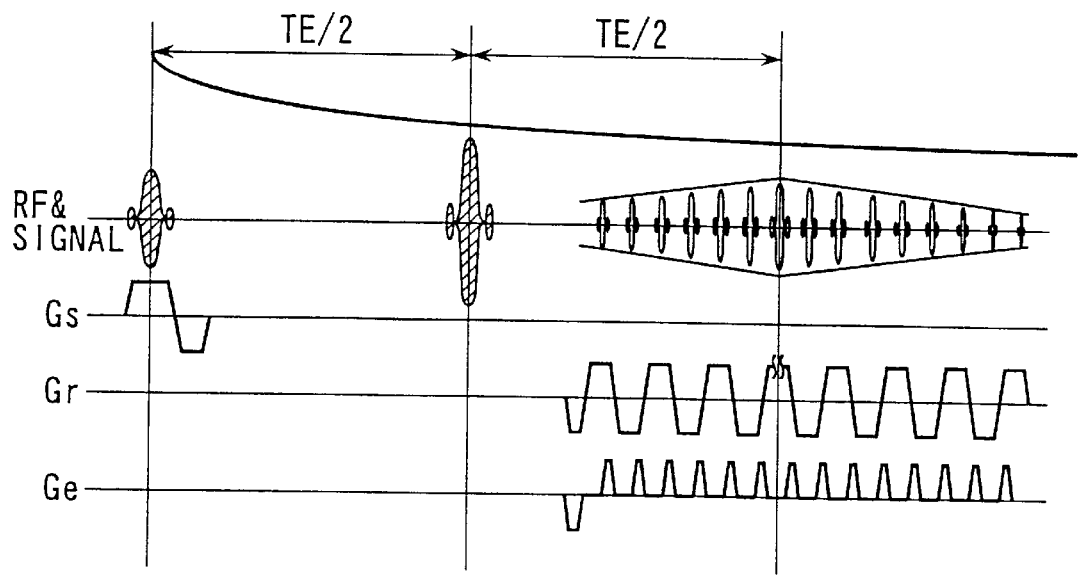
FIG. 7 is a chart showing another EPI pulse sequence.
Figure 8:
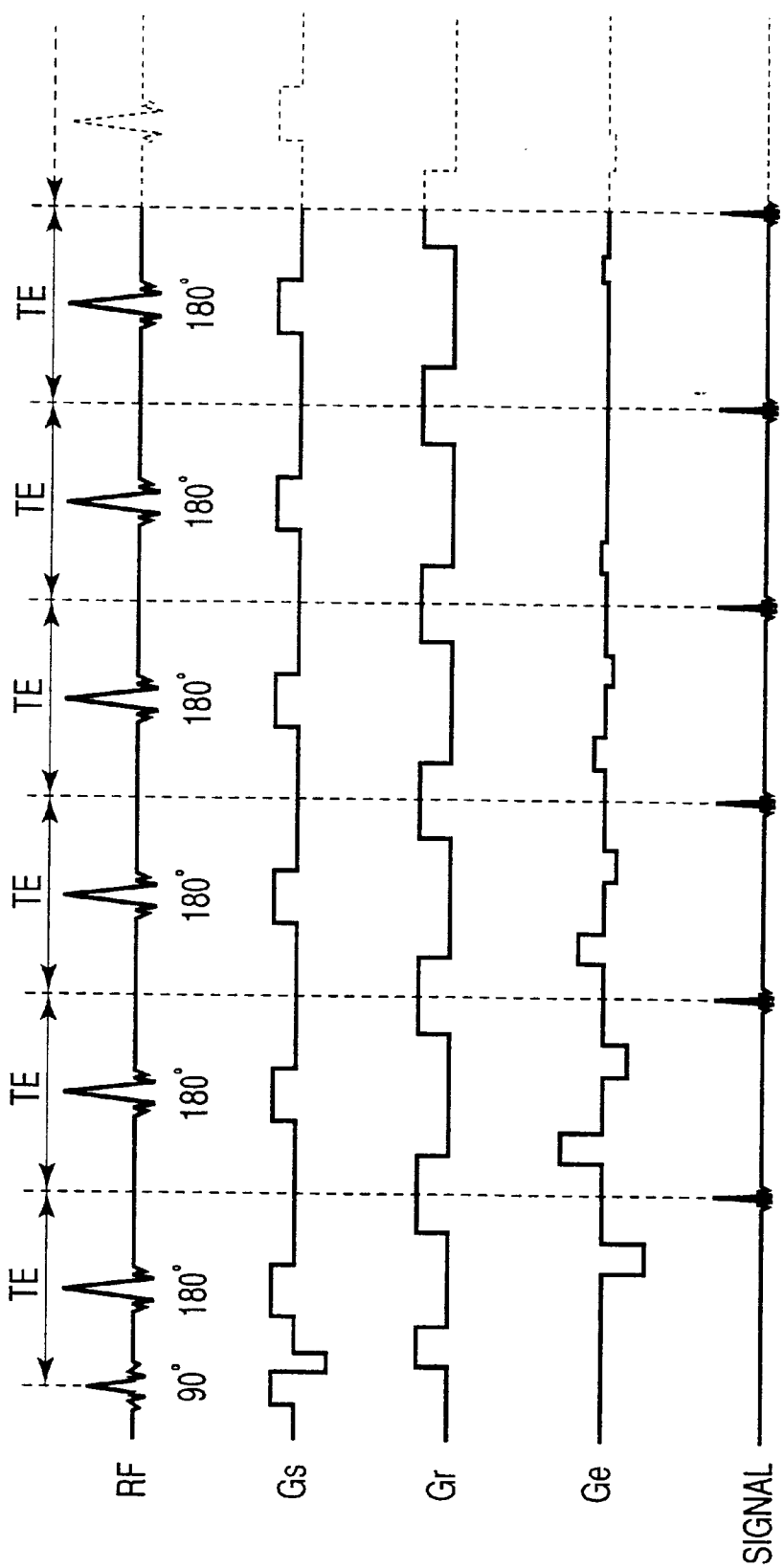
FIG. 8 is a chart showing an FSE pulse sequence as an example of a pulse sequence executed by a sequencer in FIG. 4.

FIG. 5 shows a procedure for an image generating process. First of all, a plurality of echoes are continuously generated in accordance with a multi-echo pulse sequence. In the EPI, as shown in FIGS. 6 and 7, a plurality of echoes are continuously generated by oscillating gradient fields between the positive and negative polarities after a nuclear spin is excited once. In the FSE, as shown in FIG. 8, a plurality of echoes are continuously generated by continuously applying inverting RF pulses(180°pulses) after a nuclear spin is excited once.

This data acquisition is separately performed by the data acquiring unit 11 through the first and second RF receiving coils of the RF receiving coil array 4.

First of all, the computing unit 12 separates the echo train acquired through the first RF receiving coil into a set d1$o$ of odd-numbered-echoes and a set d1$e$ of even-numbered-echoes. Likewise, the computing unit 12 separates the echo train acquired through the second RF receiving coil into a set d2$o$ of odd-numbered-echoes and a set d2$e$ of even-numbered-echoes.

The computing unit 12 then generates an image I1$o$(x,y) by two-dimensional Fourier transform (2DFT) on the basis of the echo set d1$o$. The computing unit 12 generates an image I1$e$(x,y) by two-dimensional Fourier transform (2DFT) on the basis of the echo set die. The computing unit 12 generates an image I2$o$(x,y) by two-dimensional Fourier transform (2DFT) on the basis of the echo set d2$o$. The computing unit 12 generates an image I2$e$(x,y) by two-dimensional Fourier transform (2DFT) on the basis of the echo set d2$e$. In this manner, the four types of images I1$o$(x,y), I1$e$(x,y), I2$o$(x,y), and I2$e$(x,y) are generated from the four echo sets d1$o$, d1$e$, d2$o$, and d2$e$, respectively. Since the number of encoding steps of each image is reduced to ½ due to separate multiple echoes into even-numbered-echoes and odd-numbered-echoes, aliasing of D/2 where D is the length of a reconstructing area in the encoding direction is produced in each of these four types of images.

An odd-numbered-echo-image I0$o$(x,y) without aliasing is generated by unfolding the images I1$o$(x,y) and I2$o$(x,y) respectively reconstructed from the odd-numbered-echoes acquired through the first RF receiving coil and the even-numbered-echoes acquired through the second RF receiving coil by using inverse matrixes of sensitivity distribution matrixes S1(x,y) and S2(x,y) of the first and second RF receiving coils.

Likewise, an even-numbered-echo-image without aliasing I0$e$(x,y) is generated by unfolding the images I1$e$(x,y) and I2$e$(x,y) respectively reconstructed from the even-numbered-echos acquired through the first RF receiving coil and the even-numbered-echos acquired through the second RF receiving coil by using inverse matrixes of the sensitivity distribution matrixes S1(x,y) and S2(x,y) of the first and second RF receiving coils.

This unfolding procedure is the same as that disclosed in reference (10th Ann. Scientific Meeting SMRM. 1240, 1991), and its method is almost the same as that described in "BACKGROUND OF THE INVENTION".

In this embodiment, all the odd-numbered-echo sets d1$o$ and d2$o$ and even-numbered-echo sets d1$e$ and d2$e$ are set as calculation targets by separating EPI data into odd-numbered data and even-numbered data instead of performing imaging operation upon reducing the number of encoding steps. If EPI data is separated into odd-numbered-echoes set and even-numbered-echo set in this manner, each set is equivalent to a case where imaging is performed upon reduction of the number of encoding steps to ½. Therefore, a reconstructing method associated with multiple RF coils can be used to obtain separate images.

More specifically, for the odd-numbered-echo image I0$o$(x,y) and even-numbered-echo image I0$e$(x,y), the following equations can be obtained:

$$\begin{pmatrix} I1e(x,y) \\ I2e(x,y) \end{pmatrix} = \begin{pmatrix} S1(x,y) & S1(x+D,y) \\ S2(x,y) & S2(x+D,y) \end{pmatrix} \times \begin{pmatrix} I0e(x,y) \\ I0e(x+D,y) \end{pmatrix}$$

$$\begin{pmatrix} I1o(x,y) \\ -I2o(x,y) \end{pmatrix} = \begin{pmatrix} S1(x,y) & S1(x+D,y) \\ S2(x,y) & S2(x+D,y) \end{pmatrix} \times \begin{pmatrix} I0o(x,y) \\ -I0o(x+D,y) \end{pmatrix}$$

Therefore, the images I0$o$(x,y) and I0$e$(x,y) can be obtained by multiplying inverse matrixes (unfolding):

$$\begin{pmatrix} I0e(x,y) \\ I0e(x+D,y) \end{pmatrix} = \begin{pmatrix} S1(x,y) & S1(x+D,y) \\ S2(x,y) & S2(x+D,y) \end{pmatrix}^{-1} \times \begin{pmatrix} I1e(x,y) \\ I2e(x,y) \end{pmatrix}$$

$$\begin{pmatrix} I0o(x,y) \\ -I0o(x+D,y) \end{pmatrix} = \begin{pmatrix} S1(x,y) & S1(x+D,y) \\ S2(x,y) & S2(x+D,y) \end{pmatrix}^{-1} \times \begin{pmatrix} I1o(x,y) \\ -I2o(x,y) \end{pmatrix}$$

The even-numbered-echo-image I0$e$(x,y) and odd-numbered-echo-image I0$o$(x,y) obtained in this manner have different characteristics. Their characteristics greatly differ from each other especially for a blood flow. Assume a blood flow of a constant flow velocity as an imaging target.

The even-numbered-echo-image I0$e$(x,y) is an image reconstructed from even-numbered-echoes set whose phase variance due to the flow is refocused as in so-called EER. This image therefore exhibits high blood flow extraction performance and has little blood flow artifacts. That is, the image I0$e$(x,y) has clinical effectiveness as a blood-flow-emphasized image.

The odd-numbered-echo image I0$o$(x,y) is an image reconstructed from odd-numbered-echoes set subjected to phase variance due to the blood flow. This image therefore exhibits low blood flow extraction performance. That is, the image has clinical effectiveness as a blood-flow-suppressed image.

Although each echo of the odd-numbered-echo image has undergone phase variance due to the blood flow, the phase shift amount of each echo is constant. This image is free from phase discontinuity, i.e., a phenomenon in which a phase shift of 0 and a phase shift of a given amount alternately appear every other echo, and hence has little blood flow artifacts. As for N/2 artifacts, each image is reconstructed from echoes on one side, i.e., odd-or even-numbered-echoes, and hence no N/2 artifact is produced theoretically.

In the final step, one final image I0(x,y) is obtained by synthesizing the odd-numbered-echo image I0$o$(x,y) and even-numbered-echo image I0$e$(x,y). More specifically, the final image I0(x,y) is obtained by calculating the root-sum-square of the odd-numbered-echo image I0$o$(x,y) and even-numbered-echo image I0$e$(x,y). This final image is obtained by synthesizing the images I0$o$(x,y) and I0$e$(x,y) without blood flow artifacts or N/2 artifacts. Obviously, therefore, the final image has neither blood artifacts nor N/2 artifacts. In addition, each of the images I0$o$(x,y) and I0$e$(x,y) is obtained with ½ the number of encoding steps, and hence its S/N ratio is reduced to $1/\sqrt{2}$. However, the synthesized final image exhibits no decrease in S/N ratio. As described above, a good image without blood flow artifacts or N/2 artifacts can be obtained without sacrificing S/N ratio and imaging speed.

An image representing blood flow information can also be obtained by using the odd-numbered-echo image I0$o$(x,y) and even-numbered-echo image I0$e$(x,y) obtained by the above method. For example, a phase image reflecting the velocity of a moving object such as a blood flow can be obtained by obtaining the phase difference between the odd-numbered-echo image I0o(x,y) originating from the odd-numbered-echo set and the even-numbered-echo image I0e(x,y) originating from the even-numbered-echo set, or a velocity image can be obtained by converting the phase difference into the absolute value of a velocity by using the gradient field strength used in this operation. More specifically, when a moving object such as a blood flow moves from an initial position x0 to position x(t)=v·t+x0 at time t at a constant velocity v, a phase shift θ accompanying this movement is given by $$\theta = \int_O^T \gamma G \cdot x(t)dt = \int_O^T \gamma G \cdot (v \cdot t + x0)dt$$
$$= \frac{1}{2}\gamma G \cdot v \cdot T^2 + x0 \cdot T$$

where γ is a gyromagnetic ratio, G is the strength of the gradient field to be applied, and T is the application time of a gradient field pulse G. For the sake of simplicity, assuming that x0=0, then the velocity v is given by $$v = 2\theta/\gamma G \cdot T^2$$

In this case, basically, no phase shift occurs in the even-numbered-echo image I0e(x,y) owing to the refocusing effect of the even-numbered-echoes. However, this image contains a phase error θ0 caused by other factors such as the imperfection of the apparatus and the like. On the other hand, the odd-numbered-echo image I0o(x,y) has undergone the following phase shift upon movement:

$$\theta = \frac{1}{2}\gamma G \cdot v \cdot T^2 + \theta_0$$

Like the even-numbered-echo image I0e(x,y), this odd-numbered-echo image I0o(x,y) also contains a phase error θ0 caused by other factors such as the imperfection of the apparatus and the like. To eliminate the phase errors θ0 due to other factors such as the imperfection of the apparatus and the like and obtain the phase difference based on the velocity components of the moving object such as a blood flow, the phase difference between the even-numbered-echo image I0e(x,y) and the odd-numbered-echo image I0o(x,y) is calculated. Letting Ire(x,y)even be the real part of the even-numbered-echo image I0e(x,y), Iim(x,y)even be the imaginary part of the even-numbered-echo image I0e(x,y), Ire(x,y)odd be the real part of the odd-numbered-echo image I0o(x,y), and Iim(x,y)odd be the imaginary part of the odd-numbered-echo image I0o(x,y), then the even-numbered-echo image I0e(x,y) and odd-numbered-echo image I0o(x,y) are respectively given by $$\theta(x,y)_{even} = \tan^{-1}(I_{im}(x,y)_{even}/I_{re}(x,y)_{even})$$

$$\theta(x,y)_{odd} = \tan^{-1}(I_{im}(x,y)_{odd}/I_{re}(x,y)_{odd})$$

Therefore, the velocity is obtained as follows:

$$\theta(x,y)_{odd} - \theta(x,y)_{even} = \frac{1}{2}\gamma G \cdot v(x,y) \cdot T^2$$

$$v(x,y) = 2(\theta(x,y)_{odd} - \theta(x,y)_{even})/\gamma G \cdot T^2$$

Figure 9:
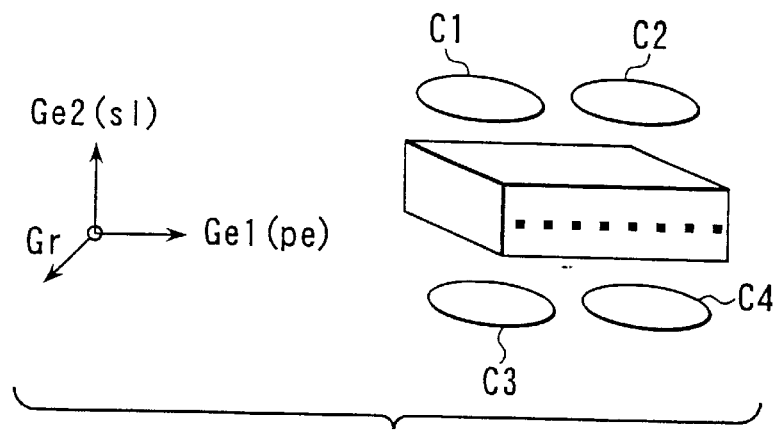
FIG. 9 is a view showing four RF receiving coils in this embodiment.
Figure 10:
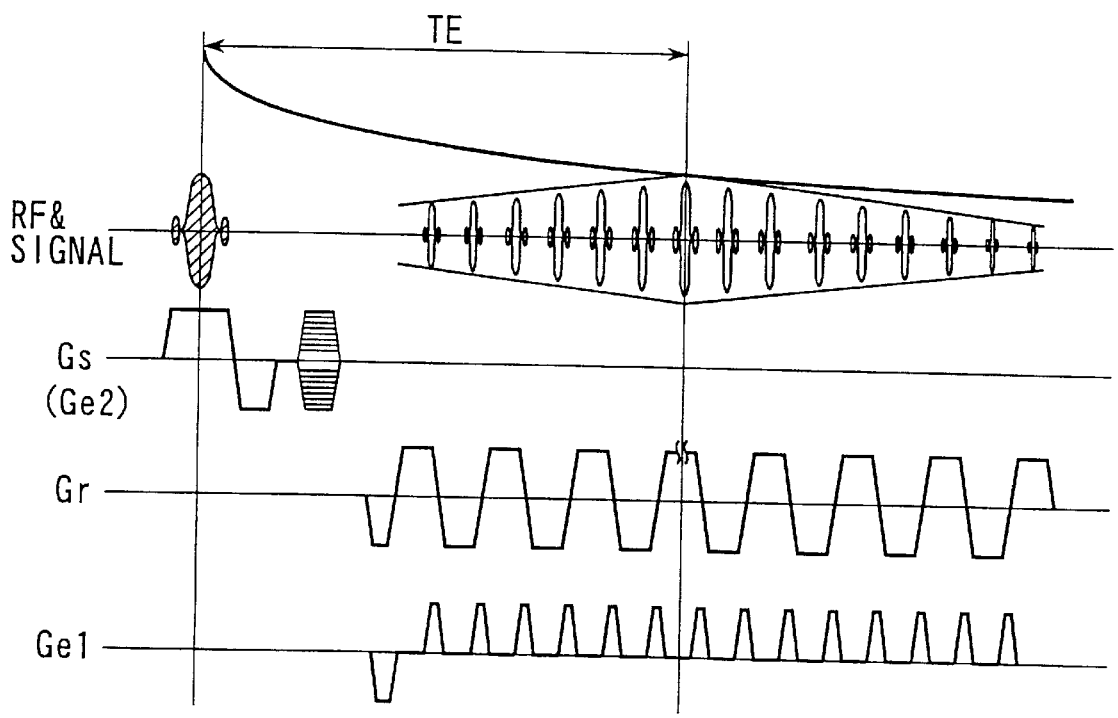
FIG. 10 is a chart showing a three-dimensional EPI pulse sequence in this embodiment.
Figure 11:
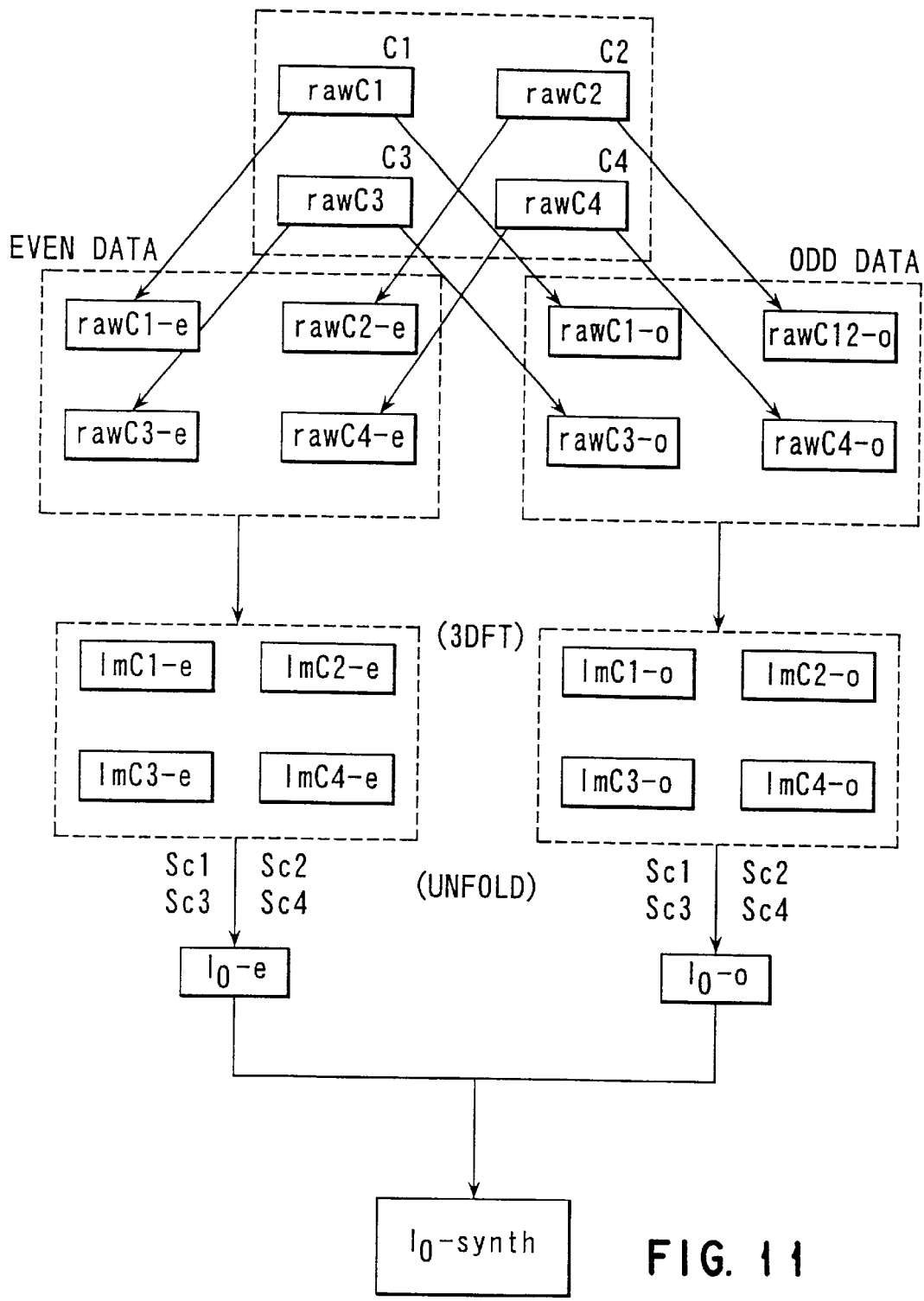
FIG. 11 is a flow chart showing a three-dimensional image generating procedure in this embodiment.
Figure 12:
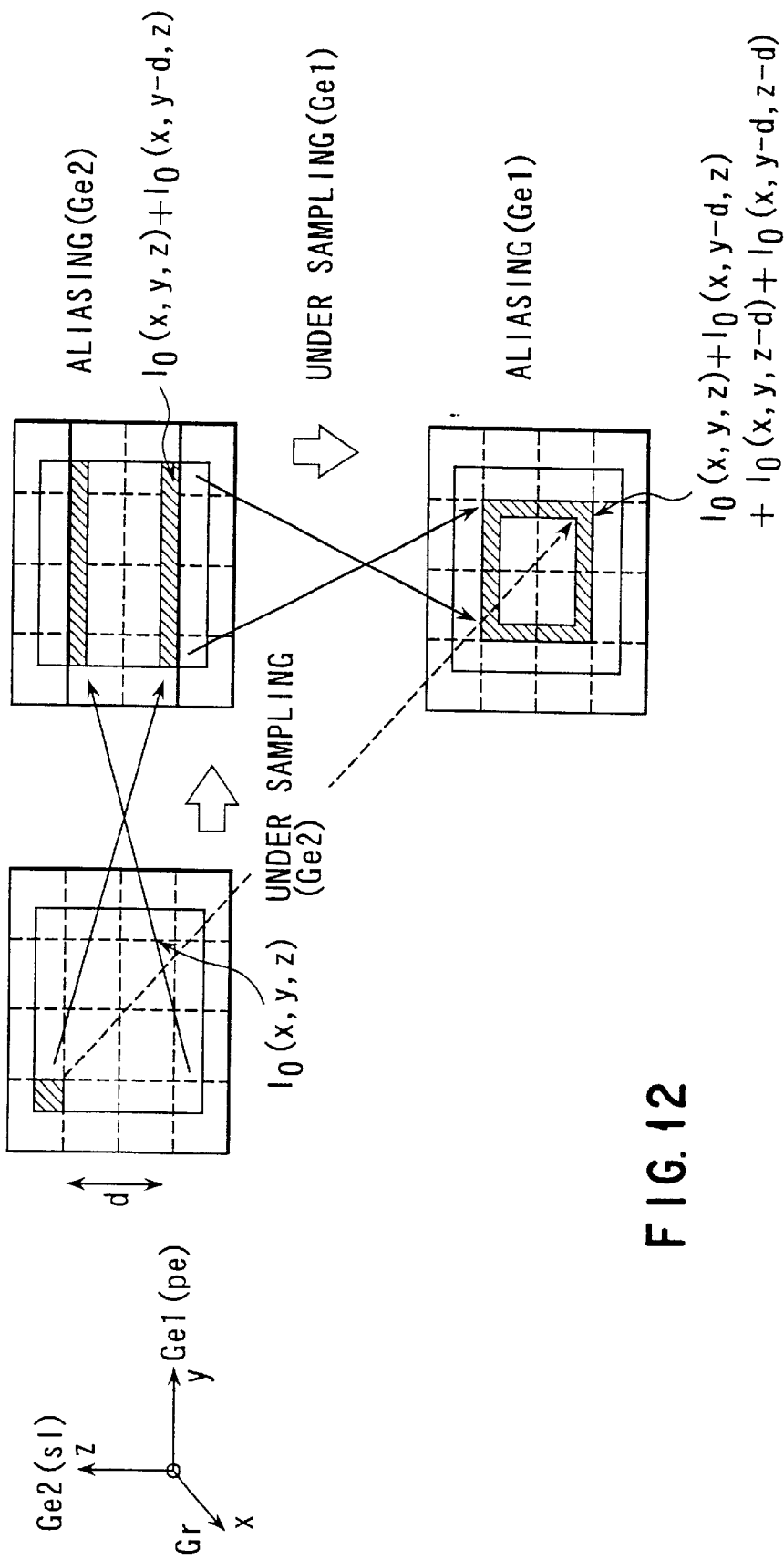
FIG. 12 is a view showing aliasing caused in two directions in three-dimensional processing.

The above method can also be applied to three-dimensional processing. Assume that four RF receiving coils C1, C2, C3, and C4 are arranged, as shown in FIG. 9. Assume also that phase encoding Ge1 is applied along the y-axis, and phase encoding Ge2 is also applied along the slice direction (z-axis), as shown in FIG. 10. In this case the number of encoding steps for Ge1 is "M", and the fast imaging method with multiple coils is used for Ge2, the number of encoding steps for Ge2 is set M/2. And this is a case that it is actually different in two encoding directions Ge1 and Ge2 in "M" though "M" should be the same in two encoding directions Ge1 and Ge2 to simplify equations here. In this case, "M1" and "M2" are given to Ge1 and Ge2 respectively. FIG. 11 shows a procedure for generating a three-dimensional image. Data are independently acquired by these four coils C1, C2, C3, and C4. The data acquired by the four coils C1, C2, C3, and C4 are respectively represented by rawC1, rawC2, rawC3, and rawC4. The respective data are separated into even-numbered data sets rawC1-e, rawC2-e, rawC3-e, and rawC4-e and old-numbered data sets rawC1-o, rawC2-o, rawC3-o, and rawC4-o as in the case of two-dimensional processing. Each data set is then independently subjected to three-dimensional Fourier transform (3DFT), thereby obtaining even-numbered-echo images ImC1-e, ImC2-e, ImC3-e, and ImC4-e and odd-numbered-echo images ImC1-o, ImC2-o, ImC3-o, and ImC4-o. Since the acquired data are separated into odd-numbered data and even-numbered data in the Ge1 direction, and the number of encoding steps is reduced to ½ in the Ge2 direction, under sampling occurs in the two directions. As a consequence, aliasing occurs in both the Ge1 direction and the Ge2 direction, as shown FIG. 12. Note that d represents the length in the encoding directions Ge1 and Ge2. And there is a case that it is actually different in two encoding directions Ge1 and Ge2 in "d" though "d" should be the same in two encoding directions Ge1 and Ge2 to simplify equations here. In this case, "d1" and "d2" are given to Ge1 and Ge2 respectively.

If, therefore, the sensitivity distributions of the respective coils are represented by Sc11, Sc12, Sc13, and Sc14, then images Ic11, Ic12, Ic13, and Ic14 obtained by the respective coils are given as follows. Note that I0 represents the original image without aliasing.

$$\begin{aligned}Ic11(x, y, z,) = {} & Sc11(x, y, z,) \cdot I_0(x, y, z,) + \\ & Sc11(x, y-d, z,) \cdot I_0(x, y-d, z,) + \\ & Sc11(x, y, z-d,) \cdot I_0(x, y, z-d,) + \\ & Sc11(x, y-d, z-d,) \cdot I_0(x, y-d, z-d,)\end{aligned}$$

$$\begin{aligned}Ic2(x, y, z,) = {} & Sc12(x, y, z,) \cdot I_0(x, y, z,) + \\ & Sc12(x, y-d, z,) \cdot I_0(x, y-d, z,) + \\ & Sc12(x, y, z-d,) \cdot I_0(x, y, z-d,) + \\ & Sc12(x, y-d, z-d,) \cdot I_0(x, y-d, z-d,)\end{aligned}$$

$$\begin{aligned}Ic3(x, y, z,) = {} & Sc13(x, y, z,) \cdot I_0(x, y, z,) + \\ & Sc13(x, y-d, z,) \cdot I_0(x, y-d, z,) + \\ & Sc13(x, y, z-d,) \cdot I_0(x, y, z-d,) + \\ & Sc13(x, y-d, z-d,) \cdot I_0(x, y-d, z-d,)\end{aligned}$$

$$\begin{aligned}Ic4(x, y, z,) = {} & Sc14(x, y, z,) \cdot I_0(x, y, z,) + \\ & Sc14(x, y-d, z,) \cdot I_0(x, y-d, z,) + \\ & Sc14(x, y, z-d,) \cdot I_0(x, y, z-d,) + \\ & Sc14(x, y-d, z-d,) \cdot I_0(x, y-d, z-d,)\end{aligned}$$

These equations can be summarized into the following matrix:

$$\begin{pmatrix} Ic1(x,y,z) \\ Ic2(x,y,z) \\ Ic3(x,y,z) \\ Ic4(x,y,z) \end{pmatrix} =$$

$$\begin{pmatrix} Scl1(x,y,z) & Scl1(x,y-d,z) & Scl1(x,y,z-d) & Scl1(x,y-d,z-d) \\ Scl2(x,y,z) & Scl2(x,y-d,z) & Scl2(x,y,z-d) & Scl2(x,y-d,z-d) \\ Scl3(x,y,z) & Scl3(x,y-d,z) & Scl3(x,y,z-d) & Scl3(x,y-d,z-d) \\ Scl4(x,y,z) & Scl4(x,y-d,z) & Scl4(x,y,z-d) & Scl1(x,y-d,z-d) \end{pmatrix}$$

$$\begin{pmatrix} I_0(x,y,z) \\ I_0(x,y-d,z) \\ I_0(x,y,z-d) \\ I_0(x,y-d,z-d) \end{pmatrix}$$

The original image I0 can therefore be obtained by multiplying an inverse matrix (unfolding).

$$\begin{pmatrix} I_0(x,y,z) \\ I_0(x,y-d,z) \\ I_0(x,y,z-d) \\ I_0(x,y-d,z-d) \end{pmatrix} =$$

$$\begin{pmatrix} Scl1(x,y,z) & Scl1(x,y-d,z) & Scl1(x,y,z-d) & Scl1(x,y-d,z-d) \\ Scl2(x,y,z) & Scl2(x,y-d,z) & Scl2(x,y,z-d) & Scl2(x,y-d,z-d) \\ Scl3(x,y,z) & Scl3(x,y-d,z) & Scl3(x,y,z-d) & Scl3(x,y-d,z-d) \\ Scl4(x,y,z) & Scl4(x,y-d,z) & Scl4(x,y,z-d) & Scl1(x,y-d,z-d) \end{pmatrix}^{-1}$$

$$\begin{pmatrix} Ic1(x,y,z) \\ Ic2(x,y,z) \\ Ic3(x,y,z) \\ Ic4(x,y,z) \end{pmatrix}$$

An even-numbered-echo-image I0-$e$(x,y) and odd-numbered-echo image I0-$o$(x,y) can be obtained by applying this unfolding to the odd-numbered-echo image and even-numbered-echo image. The even-numbered-echo image I0-$e$(x,y) is an image reconstructed from the even-numbered-echo set whose phase variance is refocused by a flow as in so-called EER, and hence exhibits high blood flow extraction performance and contains little blood flow artifacts. That is, the image I0-$e$(x,y) has clinical effectiveness as a blood-flow-emphasized image. On the other hand, the odd-numbered-echo image I0-$o$(x,y) is an image reconstructed from the odd-numbered-echo set having undergone phase variance due to a flow, and hence exhibits low blood flow extraction performance. That is, this image has clinical effectiveness as a blood-flow-suppressed image.

A synthesized image I0-synth maintaining the original S/N ratio may be obtained by synthesizing the even-numbered-echo-image I0-$e$ and odd-numbered-echo-image I0-$o$ by calculating the sum of squares. In addition, flow information may be extracted by obtaining the phase difference between these images.

In the above 3D technique, echos are acquired in the condition of encoding step M in Ge1, and in the condition of the encoding step M/2 in Ge2, by four receiving RF coils. When echos are acquired in the condition of encoding step M in Ge2, the number of receiving RF coils may be two.

The above technique can also be applied to multi-slice imaging. The above description is associated with single-slice imaging. However, in an imaging method using selective excitation method, odd-numbered-echo-images I1$o$ and I2$o$ corresponding to the first and second RF coils are separately reconstructed with respect to each of a plurality of slices from the echoes acquired by a multi-slice type pulse sequence in which excitation of other slices and echo acquisition are repeated within a repetition time. An odd-numbered-echo-image I0$o$ is generated by unfolding the odd-numbered-echo-images I1$o$ and I2$o$ corresponding to the first and second RF coils by using inverses matrixes of the sensitivity distributions of the two coils. An even-numbered-echo-image I0$e$ is then generated by unfolding even-numbered-echo-images I1$e$ and I2$e$ corresponding to the first and second RF coils by using inverse matrixes of the sensitivity distributions of the two coils. The odd-numbered-echo-image I0$o$ without aliasing and even-numbered-echo-image I0$e$ without aliasing are synthesized to separately generate final images I0 with respect to the respective slices.

The above technique can also be applied to an imaging method using another multi-echo imaging technique. For example, this technique can also be applied to single-shot FSE of generating multiple echoes by using multiplex 180°-pulses, FSE using a half Fourier method, and the like.

The above technique can also be applied to multi-shot EPI by increasing the number of multiple coils. For example, two RF coils may be used for single-shot operation, and four RF coils may be used for double-shot operation. That is, 2×N RF coils may be used for N-shot operation.

In addition, the imaging time can be shortened without decreasing the spatial resolution by using RF coils more than the number of RF coils (two or more RF coils for each direction in single-shot operation) required to reduce the above artifacts.

According to the present invention, since an image is generated from a plurality of images corresponding to a plurality of RF coils by using the sensitivity distributions of at least two RF coils, the problems of N/2 artifacts and blood flow artifacts can be solved by separately performing reconstruction processing for even-numbered-echoes and odd-numbered-echoes without sacrificing imaging time or S/N ratio. Note that an even-numbered-echo-image tends to become a blood-flow-emphasized image, and an odd-numbered-echo-image tends to become a blood-flow-suppressed image, providing clinical effects. By synthesizing these images, an image having no N/2 artifact or blood flow artifact and maintaining the original S/N can be obtained. In addition, the imaging time can be shortened by using RF coils more than the number of RF coils (two or more RF coils for each direction in single-shot operation) required to reduce the above artifacts without decreasing the spatial resolution.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a transmitting coil configured to generate RF pulses to an subject to be examined which is placed in a static field;
   a gradient coil configured to generate gradient magnetic field pulses to the subject;
   a sequencer configured to control said transmitting coil and said gradient coil to generate at least one echo train in accordance with a predetermined pulse sequence, the echo train including a series of at least N differently encoded echoes serially generated after one excitation;
   plural independent receiving coils configured to receive the echoes; and a computer configured to (a) generate a plurality of odd-numbered-echo-images respectively corresponding to said plurality of receiving coils on the basis of odd-numbered-echoes in the echo train, (b) generate a plurality of even-numbered-echo-images respectively corresponding to said plurality of receiving coils on the basis of even-numbered-echoes in the echo train, (c) generate a first image by unfolding the plural odd-numbered-echo-images on the basis of sensitivity distributions of said plural receiving coils, and (d) generate a second image by unfolding the plural even-numbered-echo-images on the basis of the sensitivity distributions of said plural receiving coils.

2. An apparatus as in claim 1 wherein said computer generates a third image from the first image and the second image.

3. An apparatus as in claim 2 wherein said computer generates the third image by calculating a root-sum-square of respectively corresponding pixels in the first image and the second image.

4. An apparatus as in claim 2 wherein said computer generates as the third image a phase image representing the velocity of moving nuclei in the subject from the first image and the second image.

5. An apparatus as in claim 1, wherein said computer (a) reconstructs the plural odd-numbered-echo-images for said plural receiving coils from the odd-numbered-echoes, and (b) reconstructs the plural even-numbered-echo-images for said plural receiving coils from the even-numbered-echoes.

6. An apparatus as in claim 1 further comprising:
a data acquiring unit configured to associate identification information and sequence information of said respective plural receiving coils with respectively corresponding echoes.

7. An apparatus as in claim 1 wherein the pulse sequence is of a type which corresponds to 2DFT to apply frequency encoding along a first axis and phase encoding along a second axis, and EPI to continuously generate the echoes by alternating the polarity of gradient magnetic field pulses.

8. An apparatus as in claim 1 wherein the pulse sequence is of a type which corresponds to 3DFT to apply frequency encoding along a first axis and phase encoding along second and third axes, and EPI to generate the echoes by alternating the polarity of gradient magnetic field pulses.

9. An apparatus as in claim 8 wherein the number of steps of applying phase encoding along the second axis is reduced corresponding to the number of said plural receiving coils.

10. An apparatus as in claim 1 wherein the pulse sequence is of a type which corresponds to 2DFT to apply frequency encoding along a first axis and phase encoding along a second axis, and FSE to generate the echoes by applying RF pulses between echoes for inverting phases of nuclear spins of the subject.

11. An apparatus as in claim 1 wherein the pulse sequence is of a type which corresponds to 3DFT to apply frequency encoding along a first axis and phase encoding along second and third axes, and FSE to generate the echoes by applying RF pulses between echoes for inverting phases of nuclear spins of the subject.

12. An apparatus as in claim 1 wherein:
the pulse sequence corresponds to a multi-slice type pulse sequence continuously generating, in sequence, echo trains from each of a plurality of slices, and
said computer generates a composite image of the odd-numbered-echo images and a composite image of the even-numbered-echo images for each of the slices.

13. A magnetic resonance imaging apparatus comprising:
a transmitting coil configured to generate RF pulses to a subject to be examined which is placed in a static field;
a gradient coil configured to generate gradient magnetic field pulses to the subject;
a sequencer configured to control said transmitting coil and said gradient coil to generate at least one echo train, the echo train including a series of at least N differently encoded echoes serially generated after one excitation;
plural independent receiving coils configured to receive the echoes; and
a computer configured to (a) generate a first image on the basis of odd-numbered-echoes in the echo train and sensitivity distributions of the plural receiving coils, and (b) generate a second image on the basis of even-numbered-echoes in the echo train and the sensitivity distributions of the plural receiving coils.

14. A magnetic resonance imaging apparatus comprising:
a transmitting coil configured to generate an RF pulse to a subject to be examined which is placed in a static field;
a gradient coil configured to generate gradient magnetic field pulses to the subject;
a sequencer configured to control said transmitting coil and said gradient coil to generate at least one echo train, the echo train including a series of at least N differently encoded echoes serially generated after one excitation;
plural independent receiving coils configured to receive the echoes; and
a computer configured to generate an image on the basis of odd-numbered-echoes in the echo train and sensitivity distributions of the plural receiving coils.

15. A magnetic resonance imaging apparatus comprising:
a transmitting coil configured to generate an RE pulse to a subject to be examined which is placed in a static field;
a gradient coil configured to generate gradient magnetic field pulses to the subject;
a sequencer configured to control said transmitting coil and said gradient coil to generate at least one echo train, the echo train including a series of at least N differently encoded echoes serially generated after one excitation;
plural independent receiving coils configured to receive the echoes; and
a computer configured to generate an image on the basis of even-numbered-echoes in the echo train and sensitivity distributions of the plural receiving coils.

* * * * *